US006905812B2

(12) United States Patent
Ray et al.

(10) Patent No.: US 6,905,812 B2
(45) Date of Patent: Jun. 14, 2005

(54) LITHOGRAPHIC PRINTING FORM AND METHOD OF PREPARATION AND USE THEREOF

(75) Inventors: Kevin Barry Ray, Castleford (GB); Peter Andrew Reath Bennett, Leeds (GB); Martyn Lott, Leeds (GB)

(73) Assignee: Kodak Polychrome Graphics LLC, Norwalk, CT (US)

( * ) Notice: Subject to any disclaimer, the term of this patent is extended or adjusted under 35 U.S.C. 154(b) by 0 days.

(21) Appl. No.: 10/290,378

(22) Filed: Nov. 7, 2002

(65) Prior Publication Data

US 2003/0129528 A1 Jul. 10, 2003

Related U.S. Application Data

(63) Continuation of application No. 09/633,030, filed on Aug. 4, 2000, now abandoned.

(51) Int. Cl.$^7$ .................................................. G03F 7/26

(52) U.S. Cl. ....................... 430/302; 430/309; 430/401; 430/434; 430/494; 430/944; 430/945; 101/463.1

(58) Field of Search .............................. 430/309, 270.1, 430/272.1, 278.1, 302, 348, 401, 434, 494, 495.1, 944, 945, 964; 101/130, 453, 463.1, 465

(56) References Cited

U.S. PATENT DOCUMENTS

| | | | | |
|---|---|---|---|---|
| 3,779,778 A | | 12/1973 | Smith et al. | 96/115 |
| 4,708,925 A | | 11/1987 | Newman | 430/270 |
| 5,372,907 A | | 12/1994 | Haley et al. | 430/157 |
| 5,372,915 A | | 12/1994 | Haley et al. | 430/302 |
| 5,466,557 A | | 11/1995 | Haley et al. | 430/278 |
| 5,491,046 A | | 2/1996 | Deboer et al. | 430/302 |
| 5,807,659 A | | 9/1998 | Nishimiya et al. | 430/302 |
| 5,858,626 A | | 1/1999 | Sheriff et al. | 430/326 |
| 6,063,544 A | | 5/2000 | Sheriff et al. | 430/271.1 |
| 6,074,802 A | | 6/2000 | Murata et al. | 430/270.1 |
| 6,083,662 A | | 7/2000 | Miller et al. | 430/302 |
| 6,090,532 A | | 7/2000 | West et al. | 430/326 |
| 6,110,646 A | | 8/2000 | Urano et al. | 430/302 |
| 6,117,610 A | | 9/2000 | Sheriff et al. | 430/190 |
| 6,117,613 A | | 9/2000 | Kawauchi et al. | 430/270.1 |
| 6,153,353 A | | 11/2000 | Van Damme et al. | 430/270.1 |
| 6,294,311 B1 | | 9/2001 | Shimazu et al. | 430/271.1 |
| 6,300,038 B1 | | 10/2001 | Shimazu et al. | 430/270.1 |
| 6,326,122 B1 | | 12/2001 | Nagasaka et al. | 430/270.1 |
| 6,326,123 B1 | | 12/2001 | West et al. | 430/270.1 |
| 6,340,551 B1 | | 1/2002 | Miyake et al. | 430/192 |
| 6,346,365 B1 | | 2/2002 | Kawauchi et al. | 430/302 |
| 6,461,795 B1 | * | 10/2002 | McCullough et al. | 430/302 |

FOREIGN PATENT DOCUMENTS

| | | |
|---|---|---|
| EP | 823 327 A2 | 2/1998 |
| EP | 894 622 A2 | 2/1999 |
| EP | 901 902 A2 | 3/1999 |
| EP | 909 657 A2 | 4/1999 |
| EP | 914 964 A2 | 5/1999 |
| EP | 919 868 A1 | 6/1999 |
| EP | 825 927 B1 | 8/1999 |
| EP | 982 123 A2 | 3/2000 |
| GB | 1245924 | 9/1971 |
| GB | 2342460 A | 4/2000 |
| WO | WO 97/39894 A1 | 7/1997 |
| WO | WO 99/31544 A1 | 7/1998 |
| WO | WO 98/42507 A1 | 10/1998 |
| WO | WO 99/01795 A2 | 1/1999 |
| WO | WO 99/01796 A2 | 1/1999 |
| WO | WO 99/08879 A1 | 2/1999 |
| WO | WO 99/11458 A1 | 3/1999 |
| WO | WO 99/21715 A1 | 5/1999 |
| WO | WO 99/21725 A1 | 6/1999 |

OTHER PUBLICATIONS

Brochure for Fuji CTP Plate Brillia Series (2000).
Brochure for AGFA Thermostar P970 and P971 (2000).

* cited by examiner

*Primary Examiner*—Barbara L. Gilliam
(74) *Attorney, Agent, or Firm*—Faegre & Benson LLP

(57) ABSTRACT

A positive working printing form precursor comprises a thermally imagable composition which includes a hydroxyl group-containing polymer, for example a novolak resin. The composition has a weight of less than 1.1 $gm^{-2}$. It has been found that using a low weight of the composition on the precursor improves the properties of the precursor, in particular by rendering the sensitivity of the precursor to imaging radiation less variable over time.

18 Claims, No Drawings

LITHOGRAPHIC PRINTING FORM AND METHOD OF PREPARATION AND USE THEREOF

This application is a continuation of Ser. No. 09/633,030, filed Aug. 4, 2000, which is now abandoned.

BACKGROUND OF THE INVENTION

1. Field of the Invention

This invention relates to lithographic printing form precursors. The invention relates further to their manufacture and use. More particularly, this invention relates to printing form precursors comprising a thermally imageable coating on a substrate, wherein the coating comprises a composition including a hydroxyl group-containing polymer.

2. Background Information

The art of lithographic printing is based on the immiscibility of ink, generally an oily formulation, and water, wherein in the traditional method the ink is preferentially retained by the image or pattern area and the water or fountain solution is preferentially retained by the non-image or non-pattern area. When a suitably prepared surface is moistened with water and an ink is then applied, the background or non-image area retains the water whilst the image area accepts ink and repels the water. The ink on the image area is then transferred to the surface of a material upon which the image is to be reproduced, such as paper, cloth and the like. Commonly the ink is transferred to an intermediate material called the blanket, which in turn transfers the ink to the surface of the material upon which the image is to be reproduced.

A generally used type of lithographic printing form precursor (by which we mean a coated printing form prior to exposure and development) has a radiation sensitive coating applied to an aluminum substrate. Negative working lithographic printing form precursors have a radiation sensitive coating which when imagewise exposed to radiation of a suitable wavelength hardens in the exposed areas. On development the non-exposed areas of the coated composition are removed leaving the image. On the other hand positive working lithographic printing form precursors have a radiation sensitive coating, which after imagewise exposure to radiation of a suitable wavelength becomes more soluble in the exposed areas than in the non-exposed areas, in a developer. In both cases only the image area on the printing form itself is ink-receptive.

The differentiation between image and non-image areas is made in the exposure process where a film is applied to the printing form precursor with a vacuum to ensure good contact. The printing form precursor is then exposed to a radiation source; conventionally this has been a UV radiation source. In the case where a positive form precursor is used, the area of the film that corresponds to the image in the printing form precursor is opaque so that no light will strike the printing form precursor, whereas the area on the film that corresponds to the non-image area is clear and permits the transmission of light to the coating which becomes more soluble and is removed on development.

Many positive working systems rely on the inhibition of the inherent solubility of phenolic resins, in suitable developers. Traditionally this has been achieved through the use of diazide moieties, especially naphthoquinone diazide (NQD) moieties, to provide compositions which only following exposure to UV radiation are soluble in the developer.

As demands on the performance of UV-sensitive positive working coatings have increased so NQD technology has become limiting. In addition, digital and laser imaging technology is making new demands on coatings for lithographic printing.

It is known from GB 1245924 that the solubility of phenolic resins in lithographic developers may be increased by the application of heat. The heat may be delivered by infra-red radiation, assisted by radiation absorbing components such as carbon black or Milori Blue (C.I. Pigment Blue 27). However the developer resistance of the non-exposed areas to commercial developers is low, and the solubility differential is low compared to the commercial UV sensitive compositions containing NQD moieties.

We have devised new positive working heat sensitive systems to meet the new demands. Our new systems and methods are the subject of our patents and patent applications including EP 825927B, WO 99/01795, WO 99/01796, WO 99/21725 and WO 99/11458. We have observed that in our new systems there may be an alteration in their sensitivity over time, after the heat sensitive composition has been applied to a substrate and dried, such effect being the result of reduced developer solubility of the unexposed compositions with time prior to exposure. Thus when we refer to "sensitivity" herein we are considering this in the context of the entire process of exposure and development. We are not referring to the matter of how the areas of the composition which are exposed react to that exposure. Sometimes this "sensitivity" is called "operating speed" in the art.

In order to overcome these problems we have devised a process which improves the systems mentioned above, such that a consistent and stable material can be supplied to an end user. This process is the subject of our patent application WO 99/21715.

WO 99/21715 discloses a method of manufacturing lithographic printing forms which includes a step of heat treating the forms, after the application and drying of the coating on the substrate, for an extended time period at 40–90° C. It is found that such heat treatment improves later exposure processes, in particular by rendering the sensitivity of the coating less variable, over time.

However, although this method is useful for providing stable and consistent lithographic printing forms, there are penalties in increased cost and production time.

We have now devised a system which produces stable and consistent lithographic printing forms without a requirement for the heat treatment step disclosed in WO 99/21715, and so offers the prospect of reduced production costs.

The compositions applied to the lithographic printing form precursors of EP 825927B, WO 98/31544, WO 99/01795, WO 99/01796, WO 99/21725 and the heat treated stabilised printing forms of WO 99/21715, have all previously been applied at coating weights of at least 1.2 $gm^{-2}$, and often considerably more.

It has been found that printing form precursors which carry certain thermally imagable compositions at low film weights do not need a heat treatment step of the type described in WO 99/21715 as part of their manufacture in order to render the sensitivity of the compositions less variable over time. It has also been found that precursors having low weights of the compositions have good resistance to handling and transportation scratch damage, and therefore the necessity to add scratch resistance additives, which may increase cost and diminish performance, is reduced.

In our patent application WO 99/11458, there are disclosed examples of phenolic compositions which are applied to substrates to form lithographic printing form precursors. In the general passages a printing form precursor is described as having an imaging layer of thickness preferably between about 0.5 and about 3 micrometers. In some of the examples coatings were applied to give a final polymeric coating weight stated to be between 1.0 and 1.5 $gm^{-2}$.

In our patent application WO 98/42507 there are described examples of phenolic resin compositions which are applied to substrates to form lithographic printing form precursors. In the general passages a printing form precursor is described as having an imaging layer of thickness, after drying, typically in the range from 0.5 to 2 m, and preferably from 1 to 1.5 m. In all of the examples the formulation was applied to give a dry coating weight of about 1.5 $gm^{-2}$.

In EP-A-894622 there are disclosed printing plate precursors having a polymeric coating which comprises a resin with phenolic hydroxyl groups and a copolymer comprising, for example, a sulfonamido group or an acrylate group. In the general passages the coated solids amount after drying is said to desirably be in the range 0.5 to 5.0 $gm^{-2}$. It is stated that as the coated amount decreases, the characteristics of the photosensitive layer become poor, although apparent sensitivity increases. In the examples in EP-A-894622 the coating amount of the polymeric coating, after drying, is 1.8 $gm^{-2}$.

In the related specifications EP-A-901902, EP-A-909657 and EP-A-914964 there is the same general reference to a coating weight of 0.5 to 5.0 $gm^{-2}$ and, in the examples, the coating weights are 1.4, 1.5, 1.8 and 2.0 $gm^{-2}$.

The foregoing specifications provide no encouragement to look at low coating weights. They in no way enable the reader to conclude or infer that use of a low weight of a coating may be beneficial in rendering the sensitivity of the coating less variable over time and/or in improving its mechanical robustness.

SUMMARY OF THE INVENTION

This invention is directed to a positive working printing form precursor which comprises a thermally imageable coating on a substrate. The coating comprises a composition including a hydroxyl group-containing polymer. The weight of the composition on the substrate is less than 1.1 $gm^{-2}$. In areas of the coating which are exposed to heat, the coating dissolves preferentially in a developer.

This invention is also directed to a method of manufacturing a printing form precursor of this invention. The precursor is manufactured by application of a composition including a hydroxyl group-containing polymer in a solvent to a substrate, and subsequent drying of the composition. The composition is applied such that the dried weight of the composition on the substrate is less than 1.1 $gm^{-2}$.

This invention is also directed to a method of producing a printing form from the printing form precursor of this invention. The precursor is imagewise exposed to heat to render the exposed areas soluble in a developer, followed by development in a developer to remove the exposed areas.

DETAILED DESCRIPTION OF THE INVENTION

In accordance with a first embodiment of this invention there is provided a positive working printing form precursor which comprises a thermally imagable coating on a substrate, the coating comprising a composition including a hydroxyl group-containing polymer, and wherein the weight of the composition on the substrate is less than 1.1 $gm^{-2}$.

Preferably the weight of the composition is at least 0.5 $gm^{-2}$, more preferably at least 0.6 $gm^{-2}$, and especially, at least 0.7 $gm^{-2}$. Preferably the weight of the composition is no more than 1.0 $gm^{-2}$, more preferably less than 1.0 $gm^{-2}$, most preferably no more than 0.95 $gm^{-2}$ and, especially, no more than 0.9 $gm^{-2}$.

The coating is such that in areas exposed to heat it dissolves preferentially in a developer. Suitably it may be patternwise exposed by direct heat, or by charged particle radiation or electromagnetic radiation, in each case converted to heat by the coating. Preferably, electromagnetic radiation is used.

A preferred composition includes a modifying means effective to alter the dissolution rate of the composition in a developer, in unheated regions, in heated regions, or both in comparison with a corresponding composition not having such modifying means. The modifying means may be covalently bonded to the hydroxyl group-containing polymer. Alternatively it may be a compound which is not covalently bonded to the hydroxyl group-containing polymer.

The modifying means may comprise a compound which is not covalently bonded to the polymer but which acts to inhibit the dissolution in an aqueous developer of the coating; such inhibition being reduced or entirely removed by the action of heat. Such a compound is hereinafter referred to as a "reversible insolubiliser compound".

A large number of reversible insolubiliser compounds have been located.

A useful class of reversible insolubiliser compounds are nitrogen containing compounds wherein at least one nitrogen atom is either quaternized or incorporated in a heterocyclic ring, or both quaternized and incorporated in a heterocyclic ring.

Examples of useful quaternized nitrogen containing compounds are triaryl methane dyes such as Crystal Violet (CI basic violet 3) and Ethyl Violet and tetraalkyl ammonium compounds such as Cetrimide.

More preferably the reversible insolubiliser compound is a nitrogen-containing heterocyclic compound. Examples of suitable nitrogen-containing heterocyclic compounds are quinoline and triazols, such as 1,2,4-triazol.

Most preferably the reversible insolubiliser compound is a quaternized heterocyclic compound. Examples of suitable quaternized heterocyclic compounds are imidazoline compounds, such as Monazoline C, Monazoline O, Monazoline CY and Monazoline T all of which are manufactured by Mona Industries, quinolinium compounds, such 1-ethyl-2-methyl quinolinium iodide and 1-ethyl-4-methyl quinolinium iodide, and benzothiazolium compounds, such as 3-ethyl-2-methyl benzothiazolium iodide, and pyridinium compounds, such as cetyl pyridinium bromide, ethyl viologen dibromide and fluoropyridinium tetrafluoroborate.

Usefully the quinolinium or benzothiazolium compounds are cationic cyanine dyes, such as Quinoldine Blue and 3-ethyl-2-[3-(3-ethyl-2(3H)-benzothiazolylidene)-2-methyl-1-propenyl]benzothiazolium iodide, and the compound of formula

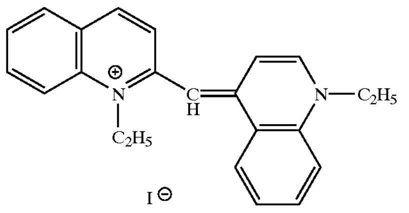

A further useful class of reversible insolubiliser compounds are carbonyl functional group containing compounds. Examples of suitable carbonyl containing compounds are -naphthoflavone, -naphthoflavone, 2,3-diphenyl-1-indeneone, flavone, flavanone, xanthone, benzophenone, N-(4-bromobutyl)phthalimide and phenanthrenequinone.

The reversible insolubiliser compound may be a compound of general formula $$Q_1—S(O)_q—Q_2$$

where $Q_1$ represents an optionally substituted phenyl or alkyl group, q represents 0, 1 or 2, and $Q_2$ represents a halogen atom or any alkoxy group. Preferably $Q_1$ represents a $C_{1-4}$ alkyl phenyl group, for example a tolyl group, or a $C_{1-4}$ alkyl group. Preferably q represents 1 or, especially, 2. Preferably $Q_2$ represents a chlorine atom or a $C_{1-4}$ alkoxy group, especially an ethoxy group.

Another useful reversible insolubiliser compound is acridine orange base (CI solvent orange 15). Other useful reversible insolubiliser compounds are ferrocenium compounds, such as ferrocenium hexafluorophosphate.

Although it is possible for a reversible insolubiliser compound to be in a separate layer from the composition comprising the polymer, for example a barrier layer preventing the developer from contacting the composition, preferably it is incorporated by admixture in the composition. Suitably, in such embodiments, the reversible insolubiliser compound constitutes at least 1%, preferably at least 2%, preferably up to 15%, more preferably up to 25% of the total weight of the composition. Thus a preferred weight range for the reversible insolubiliser compound may be expressed as 1–15% of the total weight of the composition.

There may be more then one reversible insolubilizer compound. References herein to the proportion of such compound(s) are to their total content.

Further information on systems described above is given in WO 97/39894, the contents of which are incorporated by reference in this specification.

Alternatively the modifying means may comprise functional groups Q, also providing a reversible insolubilization effect, wherein groups Q are bonded to the hydroxyl group-containing polymer, preferably via hydroxyl groups thereof, but such that the polymer retains hydroxyl groups. Thus, preferably, the functional groups Q may covalently bond to the polymeric substance through reaction with hydroxyl groups thereof, but not all of the hydroxy groups are thereby reacted.

Preferably the ratio of functional groups Q in the functionalized polymeric substance to hydroxy groups in the corresponding unfunctionalized polymeric substance is in the range 1:100 to 1:2. More preferably the functional group ratio is in the range 1:50 to 1:3. Most preferably the functional group ratio is in the range 1:20 to 1:6.

A suitable functionalized polymer may be defined by the formula $R(OH)_m(Q)_n$ where R is the polymer chain and $(Q)_n$ represents functional groups bonded thereto, and Q represents a moiety which can hydrogen bond to the polymer chain R of the same molecule or an adjacent molecule or molecules. Symbols n and m represent plural integers.

Especially preferred groups Q include —O—$SO_2$-tolyl, —O-dansyl, —O—$SO_2$-thienyl, or —O—$SO_2$-naphthyl and —O—CO—Ph. In general it is preferred that bonding to the —O— residue is by a sulfonyl or carbonyl group.

Further information on functionalized polymers of the type just described, and on their use in printing forms, is given in WO 99/01795, and the contents of that specification are incorporated in this specification by reference.

Alternatively or additionally the modifying means may comprise diazide moieties. Diazide moieties preferably comprise diazo groups $=N_2$ conjugated to carbonyl groups, preferably via an aromatic or heteroaromatic ring. In such moieties a carbonyl group is preferably bonded to the aromatic or heteroaromatic ring at an adjacent ring position to the diazo group. Preferred moieties are o-benzoquinonediazide (BQD) moieties and, especially, o-naphthoquinonediazide (NQD) moieties.

A BQD moiety may, for example, comprise the 1,4- or, preferably 1,2-benzoquinonediazide moiety.

An NQD moiety may, for example, comprise the 1,4-, 2,1- or, most preferably, the 1,2-naphthoquinone diazide moiety.

The diazide moieties may be present as compounds admixed with the polymer or, as is preferred, as moieties covalently bonded to the polymer. It should be noted that hydroxyl groups will still be present on the polymer, and further moieties may additionally be covalently bonded to the polymer; for example moieties Q, as previously described.

Further information on the use of diazides in thermally imagable printing forms is given in WO 99/01796, and the contents of that specification are incorporated in this specification by reference.

The present invention is believed applicable to heat sensitive systems described in GB 1245924, incorporated herein by reference. These include simple systems comprising a phenolic resin and a radiation absorber, preferably a black body absorber, for example carbon black or Milori Blue pigment.

The present invention is also believed applicable to heat sensitive systems described in WO 99/11458, incorporated in this specification by reference. Those systems are described as undergoing a transient solubility change in areas which are heated, such that development should be carried out reasonably soon after exposure to heat.

The present invention is also believed applicable to systems described in U.S. Pat. No. 5,491,046, incorporated herein by reference, whose heat sensitive compositions comprise latent Bronsted acids. These are negative working and positive working.

In the systems of U.S. Pat. No. 5,491,046 it is said that the heat sensitive compositions described therein may comprise a resole resin, a novolak resin, a latent Bronsted acid and an infra-red absorber, the compositions being arranged to be sensitive to both ultraviolet and infra-red radiation.

The term "latent Bronsted acid" refers to a precursor which forms a Bronsted acid by decomposition. Typical examples of Bronsted acids which are suitable for this purpose are trifluoromethane sulfonic acid and hexafluorophosphoric acid; but many examples of ionic and non-ionic latent Bronsted acids are given.

Any of the onium salts described in U.S. Pat. Nos. 4,708,925 or 3,779,778, incorporated herein by reference, can be utilized as the latent Bronsted acid.

The present invention is also applicable to the similar systems described in U.S. Pat. Nos. 5,466,557, 5,372,915 and 5,372,907, related to U.S. Pat. No. 5,491,046 and likewise incorporated herein by reference.

We also believe the present invention to be applicable to the systems described in U.S. Pat. No. 4,708,925, incorporated herein by reference, and also comprising an onium salt.

We also believe the present invention to be applicable to the heat sensitive systems described in EP 823327A, incorporated herein by reference.

The coating is preferably such that incident UV radiation does not increase its dissolution rate in an aqueous developer.

The coating is preferably such that on thermal imaging it does not undergo an irreversible chemical change. Preferred coatings are ones in which, we believe, a complex—probably involving hydrogen bonding—is disrupted by heat.

It will be appreciated that a primary object of the invention is to produce a printing form precursor in which the sensitivity (as previously defined) of the coating does not alter significantly over time. This is suitably assessed over a period of time which is the longest interval likely, between the manufacture of the printing form precursor and the use of the printing form precursor, by a customer. We regard one year as being a suitable period of time, for this assessment. In absolute terms, preferably the sensitivity reduction in a given practical developer, for example 14 wt % sodium metasilicate pentahydrate in water, of said coating over a one year period after manufacture does not exceed 15%; and preferably does not exceed 10%, even without any stabilizing heat treatment, for example as described in WO 99/21715.

A further object of the present invention is that the sensitivity of the preferred coatings should be at a practicable level after manufacture; but suitably no more than 400 $mJcm^{-2}$, preferably no more than 250 $mJcm^{-2}$, most preferably no more than 200 $mJcm^{-2}$, even without any stabilizing heat treatment, for example as described in WO 99/21715.

Preferably the composition contains at least 20%, more preferably at least 50%, most preferably at least 70% of a hydroxyl group-containing polymer, or of hydroxyl group-containing polymers in total, by weight on total weight of the composition.

The hydroxyl group-containing polymer may comprise a phenolic resin or co-polymer thereof.

Particularly useful phenolic resins in this invention are the condensation products from the interaction between phenol, C-alkyl substituted phenols (such as cresols and p-tert-butyl-phenol), diphenols (such as bisphenol-A) and aldehydes (such as formaldehyde). Dependent on the preparation route for the condensation a range of phenolic materials with varying structures and properties can be formed. Particularly useful in this invention are novolak resins, resole resins and novolak/resole resin mixtures. Most preferred are novolak resins. Examples of suitable novolak resins have the following general structure

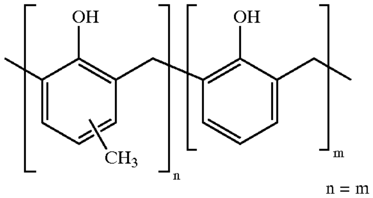

n = m

Novolak resins useful in this invention are suitably condensation reaction products between appropriate phenols, for example phenol itself, C-alkyl substituted phenols (including cresols, xylenols, p-tert-butyl-phenol, p-phenylphenol and nonyl phenols), diphenols e.g. bisphenol-A (2,2-bis(4-hydroxyphenyl)propane), and appropriate aldehydes, for example formaldehyde, chloral, acetaldehyde and furfuraldehyde. The type of catalyst and the molar ratio of the reactants used in the preparation of phenolic resins determines their molecular structure and therefore the physical properties of the resin. An aldehyde:phenol ratio between 0.5:1 and 1:1, preferably 0.5:1 to 0.8:1 and an acid catalyst is used to prepare novolak resins, which are thermoplastic in character. Higher aldehyde:phenol ratios of more then 1:1 to 3:1, and a basic catalyst, give rise to resole resins, and these are characterized by their ability to be thermally hardened at elevated temperatures.

The hydroxyl group-containing polymer may comprise a polyhydroxystyrene resin or co-polymer thereof, a co-polymer suitably being of general formula

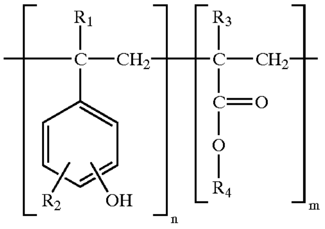

wherein $R^1$ represents a hydrogen atom or alkyl group, $R^2$ represents a hydrogen atom or alkyl group, $R^3$ represents a hydrogen atom or alkyl group, and $R^4$ represents an alkyl or hydroxyalkyl group, and wherein the ratio n/m is in the range 10/0 to 1/10.

In general terms, any alkyl group is suitably a $C_{1-12}$ alkyl group, preferably a $C_{1-6}$ alkyl group, especially a $C_{1-4}$ alkyl group. An alkyl group may be branched (for example t-butyl) or straight chain (for example n-butyl).

$R^1$ preferably represents a hydrogen atom or a $C_{1-4}$ alkyl group, especially a methyl group. Most preferably $R^1$ represents a hydrogen atom.

$R^2$ preferably represents a hydrogen atom or a $C_{1-4}$ alkyl group, especially a methyl group. Most preferably $R^2$ represents a hydrogen atom.

The hydroxy substituent of the phenyl group shown is preferably located para to the linkage of the phenyl group to the polymer backbone.

$R^3$ preferably represents a hydrogen atom or a $C_{1-4}$ alkyl group, especially a methyl group. Most preferably $R^3$ represents a hydrogen atom.

$R^4$ preferably represents a $C_{1-6}$ alkyl or $C_{1-6}$ hydroxyalkyl group. When it represents a hydroxyalkyl group the hydroxy group is preferably carried by the terminal carbon atom of the alkyl group. Examples of suitable groups $R^4$ are $—CH_3$, $—CH_2CH_2OH$, and $—CH_2CH_2CH_2CH_3$.

Preferably the ratio n/m is in the range 10/1 to 1/10, preferably 5/1 to 1/2. More preferably the ratio n/m is in the range 2/1 to 2/3. Most preferably the ratio n/m is in the range 3/2 to 2/3, especially 1/1.

The weight average molecular weight Mw of the polyhydroxystyrene polymer drawn above, as measured by gel permeation chromatography, is preferably in the range 5,000–75,000, especially 7,000–50,000. The number average molecular weight Mn of the polymer is preferably in the range 2,000–20,000, especially 3,000–8,000.

Other polymers suitable for inclusion in the composition, in admixture with or copolymerized with a hydroxyl group-containing polymer if they do not themselves comprise hydroxyl groups, include: sulfonamide polymers, copolymers of maleiimide, for example with styrene; hydroxy or carboxy functionalised celluloses; dialkylmaleiimide esters; copolymers of maleic anhydride, for example with styrene; and partially hydrolysed polymers of maleic anhydride.

The presence of a carboxylic acid derivative of a cellulosic polymer may be of benefit as we believe it confers upon the coatings improved resistance to certain organic liquids, for example petroleum ethers, alkanediols, for example hexanediol, other glycols, glycol ethers, straight-chain alkanols, for example ethanol, branched alkanols, for example isopropanol and 1-methoxypropan-2-ol, cycloalkanols, for example cyclohexanol, and beta-ketoalkanols, for example diacetone alcohols (ie 4-hydroxy-4-methyl-2-pentanone).

The composition may comprise a resin blend having as one resin component a carboxylic acid derivative of a cellulosic polymer. Preferably another component is a phenolic resin or a polyhydroxystyrene resin. For example a carboxylic acid derivative of a cellulosic polymer may be present in an amount at least 0.25%, preferably at least 0.5%, more preferably at least 1%, yet more preferably at least 2%, most preferably at least 5%, and, especially, at least 8%, of the weight of the composition. It may suitably provide up to 50%, preferably up to 30%, more preferably up to 20%, still more preferably up to 16%, and most preferably up to 12%, of the weight of the composition. Preferably the acid number of the carboxylic acid derivative of the cellulosic polymer is at least 50, more preferably at least 80, most preferably at least 100. Preferably the acid number of the carboxylic acid derivative of the cellulosic polymer does not exceed 210, and preferably does not exceed 180. "Acid number" is the number of milligrams of potassium hydroxide needed to neutralize 1 gram of the acidic compound.

A carboxylic acid derivative of a cellulosic polymer may be a carboxylic acid derivative of a cellulose alkanoate, especially of a cellulose acetate. The carboxylic acid derivative of a cellulosic polymer may be a reaction product of a cellulosic polymer and of a carboxylic acid or, especially, of an acid anhydride thereof.

Particularly preferred carboxylic acid derivatives of a cellulosic polymer are the materials commercially available under the names CAP (cellulose acetate phthalate), CAHP (cellulose acetate hydrogen phthalate—CAS No 9004-38-0) and CAT (cellulose acetate trimellitate—CAS No 52907-01-4). Cellulose acetate propionate (CAS No 9004-39-1) and cellulose acetate butyrate (CAS No 9004-36-8) are also commercially available and may be useful.

The coating is such that it is patternwise solubilized by heat, during the pattern forming (exposure) process. In broad terms there are three ways in which heat can be patternwise delivered to the coating, in use. These are:

- Direct heat, by which we mean the direct delivery of heat by a heated body, by conduction. For example the coating may be contacted by a heat stylus; or the reverse face of the substrate onto which the coating has been applied may be contacted by a heated body. A heated body may be a heat stylus.
- The use of incident electromagnetic radiation to expose the coating, the electromagnetic radiation being converted to heat. The electromagnetic radiation could for example be infra-red, or UV or visible radiation, depending on the composition. Preferably it is infra-red.
- The use of charged-particle radiation, for example electron beam radiation. Clearly, at the fundamental level the charged-particle mode and the electromagnetic mode are convergent; but the distinction is clear at the practical level.

In order to increase the utility of the preferred heat sensitive coatings used in the present invention it is beneficial in embodiments intended for exposure using electromagnetic radiation to include an additional component, namely a radiation absorbing compound capable of absorbing the incident electromagnetic radiation and converting it to heat. It may also be desirable to include a suitable radiation absorbing compound in embodiments intended for exposure using charged particle radiation.

In preferred precursors intended to use electromagnetic radiation for exposure, the coating may be such that it can be exposed by means of electromagnetic radiation of wavelength above 450 nm, preferably above 500 nm, more preferably above 600 nm, and especially above 700 nm. Most preferably it can be exposed by electromagnetic radiation above 800 nm. Suitably it can be exposed by radiation of wavelength below 1400 nm, preferably below 1200 nm. In coatings intended to require electromagnetic radiation for exposure a suitable radiation absorbing compound, to convert the radiation to heat, may usefully be a black body radiation absorber, such as carbon black or graphite. It may be a commercially available pigment such as Heliogen Green as supplied by BASF or Nigrosine Base NG1 as supplied by NH Laboratories Inc or Milori Blue (C.I. Pigment Blue 27) as supplied by Aldrich.

Preferably, precursors of the invention are imagewise exposed using a laser. Examples of lasers which can be used include semiconductor diode lasers emitting at between 450 nm and 1400 nm, especially between 600 nm and 1100 nm. Examples are the Nd YAG laser which emits at 1064 nm and the diode laser imagesetter sold by Creo under the trade mark TRENDSETTER, which emits at 830 nm, but any laser of sufficient imaging power and whose radiation is absorbed by the composition, can be used.

In certain embodiments of the invention a separate layer comprising a radiation absorbing compound can be used. This multiple layer construction can provide routes to high sensitivity as larger quantities of absorber can be used without affecting the function of the image forming layer. In principle any radiation absorbing material which absorbs sufficiently strongly in the desired band can be incorporated or fabricated in a uniform coating. Dyes, metals and pigments (including metal oxides) may be used in the form of vapor deposited layers. Techniques for the formation and use of such films are well known in the art.

Preferably, however, the radiation absorbing compound is incorporated by admixture in the composition.

Preferably the radiation absorbing compound is one whose absorption spectrum is such that absorption is significant at the wavelength output of the radiation source, preferably laser, which is to be used in the patternwise exposure of precursors of the present invention. Usefully it may be an organic pigment or dye such as phthalocyanine pigment. Alternatively it may be a dye or pigment of the squarylium, merocyanine, cyanine, indolizine, pyrylium or metal dithioline classes.

In preferred coatings intended to require infra-red radiation for patternwise exposure it is preferred that their dissolution rate in a developer is not increased by incident UV or visible radiation, so making handling of the compositions straightforward. Preferably such coatings do not comprise any UV or visible light sensitive components. However UV or visible light sensitive components which are not activated by UV or visible light due to the presence of other components, such as UV or visible light absorbing dyes or a UV or visible light absorbing topmost layer, may in principle be present in such coatings.

Pigments are generally insoluble in the compositions and so comprise particles therein (unless provided as a separate layer of a coating). Generally they are broad band absorbers, preferably able efficiently to absorb electromagnetic radiation and convert it to heat over a range of wavelengths exceeding 200 nm, preferably exceeding 400 nm. Generally they are not decomposed by the radiation. Generally they have no or insignificant effect on the solubility of the unheated coating, in the developer. In contrast dyes are generally dissolved in the compositions (unless provided as a separate layer of a coating). Generally they are narrow band absorbers, typically able efficiently to absorb electromagnetic radiation and convert it to heat only over a range of wavelengths typically not exceeding 100 nm, and so have to be selected having regard to the wavelength of the radiation which is to be used for imaging. Many dyes have a marked effect on the dissolution rate of the unheated coating in the developer, typically making it much more developer resistant. Thus a dye may be employed as a radiation absorbing compound and as a modifying means, in certain coatings of the invention.

Suitably the radiation absorbing compound, when present and admixed into the composition, is present in an amount of at least 0.25%, preferably at least 0.5%, more preferably at least 1%, most preferably at least 2%, preferably up to 25%, more preferably up to 20%, most preferably up to 15%. A preferred weight range for the radiation absorbing compound may be expressed as 2–15%. More specifically, in the case of dyes the range may preferably be 0.25–15%, preferably 0.5–8%, whilst in the case of pigments the range may preferably be 1–25%, preferably 2–15%. For pigments, 5–15% may be especially suitable. In each case the figures given are as a percentage of the total weight of the dried composition.

There may be more than one radiation absorbing compound. References herein to the proportion of such compound(s) are to their total content.

As indicated above preferred coatings used in the present invention include infra-red absorbing compounds. Examples of suitable infra-red absorbing compounds are:

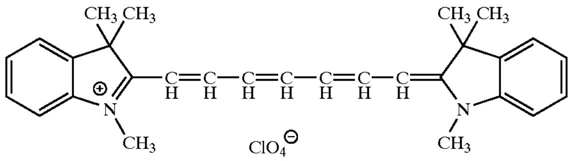

and

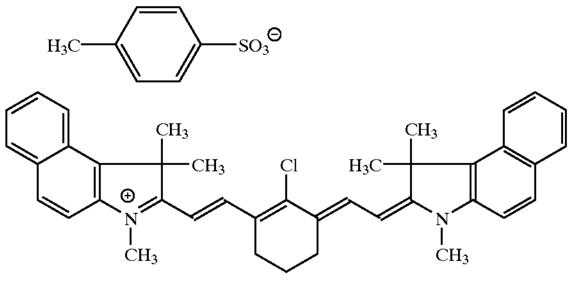

and KF654B PINA as supplied by Riedel de Haen UK, Middlesex, England, believed to have the structure:

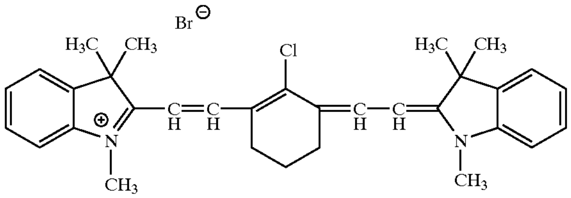

As indicated above precursors of the invention may employ one or more radiation absorbing compounds and one or more reversible insolubiliser compounds. Certain compounds are available which perform both functions. Notable among these are the cyanine dyes, which are preferred herein as radiation absorbing compounds and/or reversible insolubiliser compounds.

The coatings used in the invention may contain other ingredients such as polymeric particles, stabilising additives, inert colorants, developer resistance means and additional inert polymeric binders as are present in many positive working compositions.

Polymeric particles may confer on the coating improved mechanical properties, compared with a corresponding coating with no such particles. The coating containing polymeric particles may have improved resistance to mechanical handling equipment used in the manufacture and/or use of lithographic plate precursors.

When present the polymeric particles are suitably admixed in the composition and constitute at least 0.25%, preferably at least 0.5%, more preferably at least 1%, yet more preferably at least 2%, most preferably at least 5%, and, especially, at least 7%. Suitably the polymeric particles constitute up to 50%, preferably up to 40%, more preferably up to 30%, yet more preferably up to 25%, most preferably up to 20%, and, especially, up to 14%, by weight of the composition (the weight percentages are expressed with reference to the dried composition without the organic solvent).

Preferably the mean diameter of the polymeric particles is in the range 0.5–15 μm, preferably 1–10 μm, especially 3–7 μm, as determined visually by an operator using scanning electron microscopy and a scale. Preferably the mean diameter of the polymeric particles, as thus measured, is larger than the mean thickness of the coating. While not intending to be bound by any theory, it is believed that the presence of the particles may have a stress relieving effect and/or facilitate crack termination; and/or that they protrude from the surface and are the parts contacted by objects, and thus may protect the rest of the coating from contact with objects.

An important factor is also believed to be the surface tension at the interfaces between the particles and the composition.

Preferred particles for use in the present invention are those which are evenly dispersed in the coating, and which have relatively low critical surface tension ($Y_c$). Critical surface tension ($Y_c$) is discussed in Principles of Polymer Science, $3^{rd}$ edition, Ferdinand Rodriguez, ISBN 0891161767 at pages 367–370. Figures given herein are measured by the standard test described therein at 20° C.

Preferably the particles are of a material which has a $Y_c$ value of less than 50 $mNm^{-1}$, preferably less than 40, more preferably less than 35, and, especially, less than 25. Most preferred of all is a $Y_c$ value of less than 20.

Preferably the polymeric particles are selected from optionally substituted polyolefin, polyamide and polyacrylic particles. More preferably they are selected from polyolefins and halogenated, especially fluorinated, polyolefins. Polyethylene and polytetrafluoroethylene particles ($Y_c$ values typically about 31 and about 18.5 respectively) are especially preferred.

The composition may usefully contain a developer resistance means as defined in WO 99/21725, incorporated herein by reference. Preferably this is a siloxane, preferably constituting 1–10 wt % of the composition. Preferred siloxanes are substituted by one or more optionally-substituted alkyl or phenyl groups, and most preferably are phenylalkylsiloxanes and dialkylsiloxanes. Preferred siloxanes have between 10 and 100 —$Si(R^1)(R^2)$—O— repeat units. The siloxanes may be copolymerised with ethylene oxide and/or propylene oxide. For further information on preferred siloxanes the definitions in WO 99/21725 may be recited.

From the foregoing it will be clear that although precursors of the present invention may have multi-layer coatings (with the layer containing said polymer—that is, "the composition"—being of weight less than 1.1 $gm^{-2}$), preferred precursors of the present invention have single layer coatings.

The printing form precursor includes a substrate over which said coating is provided. The substrate may be arranged to be non-ink-accepting. The substrate may have a hydrophilic surface for use in conventional lithographic printing using a fount solution or it may have a release surface suitable for use in waterless printing.

The substrate may comprise a metal layer. Preferred metals include, zinc and titanium, with being especially preferred. The substrate may comprise an alloy of the aforesaid metals. Other alloys that may be used include brass and steel, for example stainless steel.

The substrate may comprise a non-metal layer. Preferred non-metal layers include layers of plastics, paper or the like. Preferred plastics include polyester, especially polyethylene terephthalate.

The substrate may be any type of substrate usable in printing. For example, it may comprise a cylinder or, preferably, a plate.

The substrate may be an aluminium plate which has undergone the usual anodic, graining and post-anodic treatments well known in the lithographic art for enabling a radiation sensitive composition to be coated thereon and for the surface of the support to function as a printing background. Another substrate which may be used in the present invention in the context of lithography is a plastics material base or a treated paper base as used in the photographic industry. A particularly useful plastics material base is polyethylene terephthlate which has been subbed to render its surface hydrophilic. Also a so-called coated paper which has been corona discharge treated can be used.

The substrate is suitably a rectangular body, preferably of size not greater than 2.5 m×1.5 m, more preferably of size not greater than 1.7 m×1.5 m.

Preferably the substrate on its surface to be coated, after all surface pre-treatments, has a roughness value ($R_a$) of 0.6 $\mu$m or less, more preferably 0.5 $\mu$m or less. Preferably $R_a$ is at least 0.3 $\mu$m, more preferably at least 0.4 $\mu$m.

$R_a$ is the arithmetic mean of the profile deviation of the filtered roughness profile from the centre line within the measuring length, in accordance with DIN test 4777 and the instructions given with the instruction manual issued by Hommelwerke GmbH, of Schwenningen, Germany, with the Hommel Tester T500.

When we state herein that a coating dissolves we mean that it dissolves in a selected developer, to an extent useful in a lithographic printing form development process. When we state herein that a coating does not dissolve we mean that it does not dissolve in the selected developer, to an extent useful in a lithographic printing form development process.

Thus in preferred embodiments a positive working lithographic printing form may be obtained after patternwise exposure and development of a precursor of the present invention. The dissolution rate of the coating after it has been subjected to heat during patternwise exposure is greater than the dissolution rate of the corresponding unexposed coating. In preferred embodiments this dissolution rate differential is increased by means of additional components and/or by polymer modification, as described herein. Preferably such measures reduce the dissolution rate of the coating in the developer, prior to the patternwise exposure. On subsequent patternwise exposure the exposed areas of the coating are easier to dissolve in the developer, than the unexposed areas. Therefore on patternwise exposure there is a change in the dissolution rate differential of the unexposed coating and of the exposed coating. Thus in the exposed areas the coating is preferentially dissolved, to form the pattern.

The coated printing form precursor of the invention may, in use, be patternwise heated indirectly by exposure to a short duration of high intensity radiation transmitted or reflected from the background areas of a graphic original located in contact with the recording material.

The developer is dependent on the nature of the polymeric substance, but is preferably an aqueous developer. Common components of aqueous developers are surfactants, chelating agents such as salts of ethylenediamine tetraacetic acid, organic solvents such as benzyl alcohol, and alkaline components such as inorganic metasilicates, organic metasilicates, hydroxides or bicarbonates. Preferably an aqueous developer is an alkaline developer, suitably containing an organic or, preferably, an inorganic metasilicate, for example sodium metasilicate.

In accordance with a second embodiment of the present invention there is provided a method of manufacturing a printing form precursor as defined above, particularly one having a coating with reduced sensitivity variation over time and/or improved mechanical robustness, wherein the method of manufacturing comprises the application of the composition in a solvent to the substrate, and subsequent drying of the composition, the composition being applied such that the dried weight of the composition on the substrate is less than 1.1 $gm^{-2}$. Preferably the manufacture does not include any step of heating, for stabilisation, as described in WO 99/21715, after the drying step.

In accordance with a third embodiment of the invention there is provided a method of producing a printing form from a printing form precursor of the first embodiment, comprising an exposure step of imagewise exposing areas of the coating to heat such as to render them soluble in a developer, followed by development in the developer to remove the exposed areas. The heating of areas may be effected in the different ways applicable to the different compositions, as described above.

Preferably, in this method the precursor is not subjected to an overall heating step as part of the imaging process, after the imagewise exposure to heat. Such a "reversal" heating step is sometimes effected with certain prior precursors in order to render them negative working. Preferred precursors of the invention are exclusively positive working.

The printing form of this invention may, however, be heated after development, to increase its run length on a printing press, in the process known as baking or post-baking.

The following examples more particularly serve to illustrate various embodiments of the present invention described hereinabove.

Starting Materials

The following products are referred to herein after:

Resin A: LB 6564—a phenol/cresol novolak resin supplied by Bakelite, UK.

Resin B: LB744—a cresol novolak as supplied by Bakelite.

Resin C: SILIKOPHEN P50X—a phenyl methyl siloxane as supplied by Tego Chemie Services GmbH of Essen, Germany.

IR Dye A: KF654B PINA as supplied by Allied Signal, Middlesex, UK, believed to have the structure:

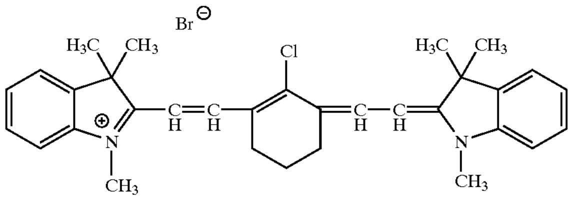

Dye A: Crystal Violet (Basic Violet 3) as supplied by Ultra Colours and Chemicals of Cheadle Hulme, Cheshire, UK, having the structure:

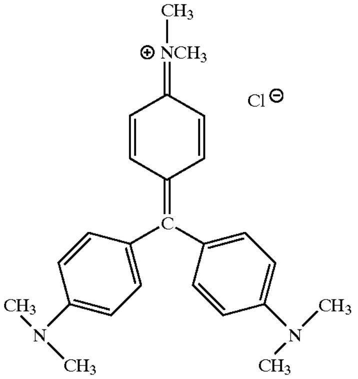

Dye B: Crystal Violet FBR (Basic Blue 5) as supplied by Ultra Colours and Chemicals, and having the structure:

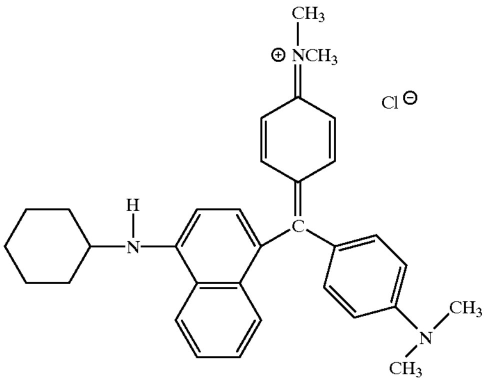

Developer A: 14% wt sodium metasilicate pentahydrate in water.

Kodak Polychrome Graphics MERCURY MARK V processor: a commercially available processor as supplied by Kodak Polychrome Graphics, Leeds, UK.

Creo TRENDSETTER 3244: a commercially available plate setter, operating at a wavelength of 830 nm, as supplied by Creo Products of Burnaby, Canada.

Creo Trendsetter AL: a commercially available plate setter, operating at a wavelength of 830 nm, as supplied by Creo Products.

GRETAGE MACBETH D19C DENSITOMETER: a commercially available densitometer as supplied by Colour Data Systems Limited of the Wirral, UK.

Gallenkamp Hotbox oven: size 2, with fan as supplied by Sanyo Gallenkamp plc of Leicester, UK.

A coating solution of composition A of Table 1 below at 17.5% by weight in 1-methoxypropan-2-ol was coated onto 0.3 mm thick sheets of aluminum that had been electrograined and anodised and post-anodically treated with an aqueous solution of an inorganic phosphate, using suitable gauges of wire wound bars to give dry coating weights of 2 and 1 $gm^{-2}$. The $R_a$ roughness value of the aluminum samples used was 0.5±0.08 $\mu$m, measured (after the abovementioned treatments) using a Hommel Tester T500 available from Hommelwerke GmbH, using a 5 $\mu$m 90° cone stylus. The samples were dried using drying conditions of 110° C. and 100° C. for 90 seconds respectively in a Mathis Labdryer oven (as supplied by Werner Mathis AG, Switzerland).

TABLE 1

| Component | Composition A Percentage dry film |
|---|---|
| Resin A | 10 |
| Resin B | 80 |
| Resin C | 6 |
| Dye A | 2 |
| IR Dye A | 2 |

The printing form precursors were stacked with interleaving (a polythene coated paper, number 22, 6 $gm^{-2}$ available from Samuel Grant, Leeds, UK) wrapped with paper (unbleached, unglazed Kraft 90 $gm^{-2}$ coated with matt black low density polythene 20 $gm^{-2}$ as supplied by Samuel Grant) and stored at ambient conditions.

The numbers underlined in the tables of results below denote readings that fall outside the acceptable variation from the expected values. The acceptable deviations from the expected dot values are ±1% on the 0, 2 and 5% dots and ±2% on all other values.

EXAMPLE 1

Real Time Ageing

Precursors of both coating weights were imaged at 1, 6, 14, 22, 28, 41, 46, 54, 63, 84, 112, 140 and 182 days of age after coating, with a 2–98% dot wedge on a Creo Trendsetter 3244 with an imaging density of 200 $mJ/cm^2$. The precursors were subsequently developed in the Mercury processor using Developer A at 22.5° C. at a throughput speed of 750 mm/min. The dot values were then determined using a Gretag D19C densitometer and compared to the expected ones. These are displayed as Tables 2 and 3 below.

TABLE 2

Percentage dot values for a 1 $gm^{-2}$ coating weight precursor.

| % Dot values | 1 day | 6 days | 14 days | 22 days | 28 days | 41 days | 46 days | 54 days | 63 days | 84 days | 112 days | 140 days | 182 days |
|---|---|---|---|---|---|---|---|---|---|---|---|---|---|
| 0 | 0 | 0 | 0 | 0 | 0 | 0 | 0 | 0 | 0 | 0 | 0 | 0 | 0 |
| 2 | 2 | 3 | 2 | 2 | 2 | 2 | 2 | 2 | 2 | 2 | 2 | 2 | 2 |
| 5 | 4 | 6 | 5 | 5 | 5 | 5 | 5 | 5 | 5 | 5 | 5 | 5 | 5 |
| 10 | 10 | 11 | 10 | 10 | 10 | 10 | 10 | 11 | 10 | 10 | 10 | 10 | 10 |
| 20 | 20 | 21 | 20 | 20 | 20 | 20 | 20 | 20 | 20 | 20 | 20 | 20 | 20 |
| 30 | 29 | 31 | 30 | 30 | 30 | 30 | 30 | 30 | 30 | 30 | 30 | 31 | 31 |
| 40 | 39 | 40 | 40 | 39 | 39 | 39 | 39 | 40 | 39 | 40 | 39 | 39 | 40 |
| 50 | 49 | 50 | 49 | 50 | 50 | 50 | 49 | 50 | 49 | 50 | 50 | 50 | 50 |
| 60 | 59 | 60 | 59 | 59 | 59 | 59 | 59 | 59 | 59 | 59 | 59 | 59 | 59 |
| 70 | 69 | 70 | 69 | 69 | 69 | 69 | 69 | 69 | 69 | 69 | 69 | 69 | 69 |
| 80 | 79 | 80 | 79 | 79 | 79 | 79 | 79 | 79 | 79 | 79 | 79 | 79 | 79 |
| 90 | 89 | 90 | 90 | 90 | 90 | 91 | 90 | 90 | 90 | 90 | 90 | 90 | 90 |
| 95 | 95 | 95 | 95 | 95 | 95 | 95 | 95 | 95 | 95 | 95 | 95 | 95 | 95 |
| 98 | 98 | 98 | 98 | 98 | 98 | 98 | 98 | 98 | 98 | 98 | 98 | 98 | 99 |
| 100 | 100 | 100 | 100 | 100 | 100 | 100 | 100 | 100 | 100 | 100 | 100 | 100 | 100 |

TABLE 3

Percentage dot values for a 2 $gm^{-2}$ coating weight precursor.

| % Dot values | 1 day | 6 days | 14 days | 22 days | 28 days | 41 days | 46 days | 54 days | 63 days | 84 days | 112 days | 140 days | 182 days |
|---|---|---|---|---|---|---|---|---|---|---|---|---|---|
| 0 | 0 | 0 | 0 | 0 | 0 | 0 | 0 | 0 | 0 | 0 | 0 | 0 | 0 |
| 2 | 2 | 2 | 5 | 2 | 3 | 2 | 2 | 3 | 2 | 2 | 3 | 3 | 4 |
| 5 | 5 | 6 | 8 | 5 | 6 | 4 | 5 | 6 | 5 | 5 | 7 | 5 | 6 |
| 10 | 10 | 11 | 13 | 10 | 12 | 10 | 11 | 11 | 10 | 10 | 13 | 12 | 13 |
| 20 | 20 | 22 | 23 | 20 | 23 | 20 | 22 | 22 | 21 | 21 | 23 | 22 | 25 |
| 30 | 30 | 33 | 33 | 30 | 33 | 31 | 33 | 33 | 33 | 32 | 34 | 34 | 35 |
| 40 | 40 | 43 | 42 | 40 | 43 | 41 | 43 | 42 | 43 | 43 | 44 | 45 | 45 |
| 50 | 50 | 54 | 52 | 51 | 53 | 52 | 53 | 53 | 53 | 53 | 55 | 55 | 56 |
| 60 | 60 | 63 | 61 | 60 | 63 | 61 | 62 | 62 | 62 | 63 | 64 | 65 | 65 |
| 70 | 70 | 73 | 70 | 70 | 72 | 71 | 72 | 72 | 72 | 72 | 74 | 74 | 75 |
| 80 | 80 | 82 | 80 | 80 | 81 | 80 | 82 | 82 | 81 | 81 | 82 | 83 | 83 |
| 90 | 90 | 92 | 90 | 90 | 91 | 91 | 92 | 92 | 92 | 91 | 91 | 92 | 92 |
| 95 | 96 | 96 | 96 | 96 | 96 | 95 | 96 | 96 | 96 | 96 | 96 | 97 | 97 |
| 98 | 99 | 99 | 99 | 99 | 99 | 99 | 99 | 99 | 99 | 99 | 99 | 99 | 99 |
| 100 | 100 | 100 | 100 | 100 | 100 | 100 | 100 | 100 | 100 | 100 | 100 | 100 | 100 |

For the 2 $gm^{-2}$ coating weight precursor, the readings vary more, and the variations appear to become more marked, with time, than for the 1 $gm^{-2}$ coating weight precursor.

EXAMPLE 2

Exposure Latitude

Precursors of 7 and 42 days of age, of both coating weights, were imaged with a 2 to 98% dot wedge at a range of imaging energies (130 to 440 $mJcm^{-2}$) on the Creo Trendsetter 3244. The precursors were subsequently developed in the Mercury processor using Developer A at 22.5° C. at a throughput speed of 750 mm/min. The dot values were then read using a Gretag D19C densitometer and the results produced were used to determine the range of imaging energies at which the actual dot values were within an acceptable level of variation to the expected ones (known by those skilled in the art as "exposure latitude").

The results can be seen in Table 4.

TABLE 4 exposure latitudes:

| | | Precursor Age | |
|---|---|---|---|
| | | 7 days | 42 days |
| Film weight | 1 $gm^{-2}$ | <130 $mJcm^{-2}$ to >440 $mJcm^{-2}$ | 200 $mJcm^{-2}$ to 440 $mJcm^{-2}$ |
| | 2 $gm^{-2}$ | 200 $mJcm^{-2}$ to 375 $mJcm^{-2}$ | 250 $mJcm^{-2}$ to 375 $mJcm^{-2}$ |

This shows that the lower coating weight precursor has the better exposure latitude (greater range) after seven days and also after six weeks.

EXAMPLE 3

Accelerated Ageing:

43 day old samples of precursors of both coating weights were aged artificially (wrapped in unbleached, unglazed Kraft paper 90 $gm^{-2}$ coated with matt black low density polythene 20 $gm^{-2}$ as supplied by Samuel Grant)) by placement in a Gallenkamp Hotbox oven at 60° C. for 1 and 3 days. On removal, the precursors alongside a 46-day old precursor that had not been aged artificially (the standard), were imaged, developed and had densitometer readings taken with the Gretag densitometer as described previously. The dot values obtained are displayed in Tables 5 and 6 below.

TABLE 5

Dot values for 1 $gm^{-2}$ coating on a precursor aged for 46 days, and on precursors given accelerated ageing.

| % Dot Values | 46 days | 1 Dy 60° C. | 3 Dys 60° C. |
|---|---|---|---|
| 0 | 0 | 0 | 0 |
| 2 | 2 | 3 | 2 |
| 5 | 5 | 6 | 6 |
| 10 | 10 | 11 | 11 |
| 20 | 20 | 22 | 22 |
| 30 | 30 | 32 | 33 |
| 40 | 39 | 42 | 42 |
| 50 | 49 | 52 | 53 |
| 60 | 59 | 62 | 62 |
| 70 | 69 | 72 | 71 |
| 80 | 79 | 81 | 81 |
| 90 | 90 | 92 | 91 |
| 95 | 95 | 96 | 96 |
| 98 | 98 | 99 | 99 |
| 100 | 100 | 100 | 100 |

TABLE 6

Dot values for 2 $gm^{-2}$ coating on a precursor aged for 46 days, and on precursors given accelerated ageing.

| % Dot Values | 46 days | 1 Dy 60° C. | 3 Dys 60° C. |
|---|---|---|---|
| 0 | 0 | 0 | 0 |
| 2 | 2 | 9 | 5 |
| 5 | 5 | 13 | 10 |
| 10 | 11 | 21 | 17 |
| 20 | 22 | 34 | 29 |
| 30 | 32 | 45 | 42 |
| 40 | 43 | 53 | 51 |
| 50 | 53 | 64 | 59 |
| 60 | 62 | 71 | 68 |
| 70 | 72 | 79 | 76 |
| 80 | 82 | 86 | 84 |
| 90 | 92 | 94 | 92 |
| 95 | 96 | 97 | 99 |
| 98 | 99 | 99 | 100 |
| 100 | 100 | 100 | 100 |

This test is useable for assessing the stability of the coatings. It can be seen that the 1 $gm^{-2}$ coatings are less affected by the ageing than the 2 $gm^{-2}$ coatings.

EXAMPLE 5

Sucker Marking:

An assessment was made of the damage done to a coating's surface due to the Creo Trendsetter's automatic loading mechanism. Samples of both coating weights at 43 days old, and a standard positive working thermal printing form precursor sold by Kodak Polychrome Graphics under the trade mark ELECTRA 830 were loaded into the Creo Trendsetter and imaged with a 50% checkerboard image at 200 $mJcm^{-2}$. These were developed through a Mercury processor containing Developer A at 24.5° C., transporting at 750 mm/min throughput speed. The coatings' surfaces were examined visually for signs of marking from the suckers of the automatic loading mechanism and give a degree of marking ranking value. This ranking system ranks a 0 as a surface that showed no visible markings and a 7 as one with an easily visible mark. Using this system the ELECTRA 830 sample was given a ranking of 4, the 2.0 $gm^{-2}$ plate at 43 days old, a ranking value of 4 and the 1.0 $gm^{-2}$ plate at 43 days old a ranking of 0.

EXAMPLES 6–11

Coating solutions of the compositions in the table 7 below at 17.5% by weight in 1-methoxypropan-2-ol were coated onto 0.3 mm thick sheets of aluminum that had been electrograined and anodised and post-anodically treated with an aqueous solution of an inorganic phosphate, using suitable gauges of wire wound bars to give dry coating weights of 2 and 1 $gm^{-2}$ The samples were dried using drying conditions of 110° C. and 100° C. for 90 seconds respectively in a Mathis Labdryer oven. The $R_a$ roughness value of the aluminum samples used was 0.5±0.08 μm, measured (after the above-mentioned treatments) using a Hommel Tester T500 available from Hommelwerke GmbH, using a 5 μm 90° cone stylus. The samples were dried using drying conditions of 110° C. and 100° C. for 90 seconds respectively in a Mathis Labdryer oven (as supplied by Werner Mathis AG, Switzerland).

TABLE 7

| | Ex. 6 | Ex. 7 | Ex. 8 | Ex. 9 | Ex. 10 | Ex. 11 |
|---|---|---|---|---|---|---|
| Component | Percentage dry film | | | | | |
| Resin A | | 10 | 6.6 | 3.4 | 10 | 10 |
| Resin B | 91.5 | 80 | 83.9 | 87.6 | 80 | 80 |
| Resin C | 6 | 6 | 6 | 6 | 6 | 6 |
| IR Dye A | 2 | 2 | 2 | 2 | 2 | 2 |
| Dye A | 0.5 | 2 | 1.5 | 1 | 2 | |
| Dye B | | | | | | 2 |

The printing form precursors were stacked with interleaving (a polythene coated paper, number 22, $gm^{-2}$ available from Samuel Grant, Leeds, UK) wrapped with paper (unbleached, unglazed Kraft 90 $gm^{-2}$ coated with matt black low density polythene 20 $gm^{-2}$ as supplied by Samuel Grant) and stored at ambient conditions.

Examples 6 to 9, precursors of both coating weights were imaged at 1 day and 2, 4, 6 and 8 weeks with a 2 to 98% dot wedge at a range of imaging energies (140 $mJcm^{-2}$ to 240 $mJcm^{-2}$, in increments of 20 $mJcm^{-2}$) on the Creo Trendsetter 3244. For examples 10 and 11, precursors of both coating weights were imaged at 1 day, and 1, 2, 4, 6 and 8 weeks with a 2 to 98% dot wedge with the same range of imaging energies. The precursors were subsequently developed in the Mercury processor using Developer A at 22.5° C. at a throughput speed of 750 mm/min. The dot values were then read using a Gretag D19C densitometer and the results produced were used to determine the range of imaging energies at which the actual dot values were within an acceptable level of variation to the expected ones (i.e. exposure latitude).

As before the acceptable deviations from the expected dot values are ±1% on the 0, 2 and 5% dots and ±2% on all other values.

The results are given in the following tables.

| Plate age | 1 gm$^{-2}$ film weight | 2 gm$^{-2}$ film weight |
|---|---|---|
| | Example 6 | |
| 1 day old | <140 mJcm$^{-2}$ to >240 mJcm$^{-2}$ | 220 mJcm$^{-2}$ to >240 mJcm$^{-2}$ |
| 2 weeks old | <140 mJcm$^{-2}$ to >240 mJcm$^{-2}$ | 200 mJcm$^{-2}$ to >240 mJcm$^{-2}$ |
| 4 weeks old | <140 mJcm$^{-2}$ to >240 mJcm$^{-2}$ | 200 mJcm$^{-2}$ to >240 mJcm$^{-2}$ |
| 6 weeks old | <140 mJcm$^{-2}$ to >240 mJcm$^{-2}$ | 220 mJcm$^{-2}$ to >240 mJcm$^{-2}$ |
| 8 weeks old | <140 mJcm$^{-2}$ to >240 mJcm$^{-2}$ | >240 mJcm$^{-2}$ |
| | Example 7 | |
| 1 day old | <140 mJcm$^{-2}$ to >240 mJcm$^{-2}$ | >240 mJcm$^{-2}$ |
| 2 weeks old | <140 mJcm$^{-2}$ to >240 mJcm$^{-2}$ | >240 mJcm$^{-2}$ |
| 4 weeks old | <140 mJcm$^{-2}$ to >240 mJcm$^{-2}$ | >240 mJcm$^{-2}$ |
| 6 weeks old | <140 mJcm$^{-2}$ to >240 mJcm$^{-2}$ | 180 mJcm$^{-2}$ to >240 mJcm$^{-2}$ |
| 8 weeks old | <140 mJcm$^{-2}$ to >240 mJcm$^{-2}$ | >240 mJcm$^{-2}$ |
| | Example 8 | |
| 1 day old | <140 mJcm$^{-2}$ to >240 mJcm$^{-2}$ | >240 mJcm$^{-2}$ |
| 2 weeks old | <140 mJcm$^{-2}$ to >240 mJcm$^{-2}$ | >240 mJcm$^{-2}$ |
| 4 weeks old | <140 mJcm$^{-2}$ to >240 mJcm$^{-2}$ | >240 mJcm$^{-2}$ |
| 6 weeks old | <140 mJcm$^{-2}$ to >240 mJcm$^{-2}$ | 220 mJcm$^{-2}$ to >240 mJcm$^{-2}$ |
| 8 weeks old | <140 mJcm$^{-2}$ to >240 mJcm$^{-2}$ | >240 mJcm$^{-2}$ |
| | Example 9 | |
| 1 day old | <140 mJcm$^{-2}$ to >240 mJcm$^{-2}$ | 220 mJcm$^{-2}$ to >240 mJcm$^{-2}$ |
| 2 weeks old | <140 mJcm$^{-2}$ to >240 mJcm$^{-2}$ | 200 mJcm$^{-2}$ to >240 mJcm$^{-2}$ |
| 4 weeks old | <160 mJcm$^{-2}$ to >240 mJcm$^{-2}$ | >240 mJcm$^{-2}$ |
| 6 weeks old | <140 mJcm$^{-2}$ to >240 mJcm$^{-2}$ | 220 mJcm$^{-2}$ to >240 mJcm$^{-2}$ |
| 8 weeks old | <140 mJcm$^{-2}$ to >240 mJcm$^{-2}$ | >240 mJcm$^{-2}$ |
| | Example 10 | |
| 1 day old | <140 mJcm$^{-2}$ to >240 mJcm$^{-2}$ | 220 mJcm$^{-2}$ to >240 mJcm$^{-2}$ |
| 1 week old | 160 mJcm$^{-2}$ to >240 mJcm$^{-2}$ | >240 mJcm$^{-2}$ |
| 2 weeks old | 160 mJcm$^{-2}$ to >240 mJcm$^{-2}$ | >240 mJcm$^{-2}$ |
| 4 weeks old | <140 mJcm$^{-2}$ to >240 mJcm$^{-2}$ | >240 mJcm$^{-2}$ |
| 6 weeks old | <140 mJcm$^{-2}$ to >240 mJcm$^{-2}$ | >240 mJcm$^{-2}$ |
| 8 weeks old | <140 mJcm$^{-2}$ to >240 mJcm$^{-2}$ | >240 mJcm$^{-2}$ |
| | Example 11 | |
| 1 day old | <140 mJcm$^{-2}$ to >240 mJcm$^{-2}$ | >240 mJcm$^{-2}$ |
| 1 week old | <140 mJcm$^{-2}$ to >240 mJcm$^{-2}$ | 220 mJcm$^{-2}$ to >240 mJcm$^{-2}$ |
| 2 weeks old | <140 mJcm$^{-2}$ to >240 mJcm$^{-2}$ | >240 mJcm$^{-2}$ |
| 4 weeks old | <140 mJcm$^{-2}$ to >240 mJcm$^{-2}$ | >240 mJcm$^{-2}$ |
| 6 weeks old | 160 mJcm$^{-2}$ to >240 mJcm$^{-2}$ | >240 mJcm$^{-2}$ |
| 8 weeks old | <140 mJcm$^{-2}$ to >240 mJcm$^{-2}$ | >240 mJcm$^{-2}$ |

These results show that the lower coating weight precursors have consistently superior exposure latitude.

Although this invention has been illustrated by reference to specific embodiments, it will be apparent to those skilled in the art that various changes and modifications may be made which clearly fall within the scope of this invention.

What is claimed is:

1. A method of producing a printing form from a printing form precursor, the method comprising:

(a) providing a positive working printing form precursor having a thermally imageable coating on a substrate, wherein the precursor is prepared by:

(i) applying to the substrate a composition in a solvent, wherein the composition includes a phenolic resin, and (ii) subsequently removing solvent to leave an imageable coating on the substrate, such that the weight of the imageable coating on the substrate is less than 1.1 gm$^{-2}$;

(b) following a period of at least 6 days after the precursor is prepared, exposing selected areas of the coating to heat, thereby rendering the exposed areas preferentially soluble in a developer solution, with the proviso that the precursor is not subjected to heat treatment after being prepared and prior to exposing; and (c) developing the precursor in the developer solution to remove the exposed areas, wherein the developer solubility of the unexposed areas at the time of exposing is not significantly changed, as compared to the developer solubility of unexposed areas for an identically prepared precursor exposed after a period of only one day following preparation.

2. The method of claim 1, wherein the substrate has a surface roughness value $R_a$ in the range 0.3 to 0.6 $\mu$m.

3. The method of claim 1, wherein the phenolic resin comprises a novolak resin.

4. The method of claim 1, wherein the phenolic resin comprises a polyhydroxystyrene resin.

5. The method of claim 1, wherein the coating comprises a radiation absorbing compound, and the step of exposing selected areas of the coating is done by a method selected from the group consisting of (i) contacting the precursor with a heated body; (ii) exposing the coating to charged particle radiation, wherein the radiation is converted to heat by the radiation absorbing compound; and (iii) exposing the coating to electromagnetic radiation, wherein the radiation is converted to heat by the radiation absorbing compound.

6. The method of claim 1, wherein the coating is imageable only by exposure to electromagnetic radiation entirely or predominantly in the range 600 to 1400 nm, and wherein the step of exposing includes exposing the selected areas of the coating to electromagnetic radiation in the range 600 to 1400 nm.

7. The method of claim 1, wherein the coating includes a modifying means for modifying the dissolution rate of the coating in a developer compared to when the modifying means is not present in the coating.

8. The method of claim 1, wherein the weight of the imageable coating on the substrate is no more than 1.0 gm$^{-2}$.

9. The method of claim 1, wherein the weight of the imageable coating on the substrate is 1.0 gm$^{-2}$.

10. The method of claim 1, wherein the imageable coating comprises:

at least 70% by weight of phenolic resins;

at least 1% by weight of a reversible insolubilizer compound;

at least 0.5% by weight of an infrared absorber compound; and

1% to 10% by weight of a siloxane.

11. The method of claim 10, wherein the imageable coating comprises 2% to 15% by weight of the reversible insolubilizer compound.

12. The method of claim 10, wherein the imageable coating comprises 0.5% to 8% by weight of a dye as the infrared absorber compound.

13. The method of claim 10, wherein the imageable coating comprises 5% to 15% by weight of a pigment as the infrared absorber compound.

14. The method of claim 1, wherein the precursor is not subjected to a heat treatment in the range 40 to 90° C. after being prepared and prior to exposing.

15. The method of claim 1, wherein the step of exposing selected areas of the coating to heat follows a period of at least 28 days after the precursor is prepared.

16. The method of claim 1, wherein the step of exposing selected areas of the coating to heat follows a period of at least 63 days after the precursor is prepared.

17. The method of claim 1, wherein the step of exposing selected areas of the coating to heat follows a period of at least 182 days after the precursor is prepared.

18. A printing form produced by the method of claim 1.

* * * * *